(12) United States Patent
Yu

(10) Patent No.: US 6,413,829 B1
(45) Date of Patent: Jul. 2, 2002

(54) FIELD EFFECT TRANSISTOR IN SOI TECHNOLOGY WITH SCHOTTKY-CONTACT EXTENSIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/872,719

(22) Filed: Jun. 1, 2001

(51) Int. Cl.$^7$ .............................................. H01L 21/331
(52) U.S. Cl. ..................... 438/311; 438/226; 438/231; 438/232; 257/66; 257/347; 257/349
(58) Field of Search .......................... 257/66, 347, 349, 257/353, 354; 438/231, 226, 232, 233

(56) References Cited

U.S. PATENT DOCUMENTS 5,998,807 A * 12/1999 Lustig et al. ................ 257/347
6,165,826 A * 12/2000 Chau et al. .................. 438/226
6,339,244 B1 * 1/2002 Krivokapic ................. 257/349

* cited by examiner

Primary Examiner—Hoai V. Ho
Assistant Examiner—Mai-Huong Tran

(74) Attorney, Agent, or Firm—Monica H. Choi

(57) ABSTRACT

For forming a field effect transistor on a buried insulating material in SOI (semiconductor on insulator) technology, a gate dielectric and a gate electrode are formed on the semiconductor material, and spacers are formed on sidewalls of the gate electrode and the gate dielectric. The spacers cover portions of the semiconductor material. A dopant is implanted into exposed regions of the semiconductor material to form a drain doped region and a source doped region. A portion of the drain doped region and a portion of the source doped region extend under the spacers. A drain contact silicide is formed with an exposed portion of the drain doped region, and a source contact silicide is formed with an exposed portion of the source doped region. The spacers are removed to expose the portions of the semiconductor material including a portion of the drain doped region and a portion of the source doped region. A drain extension silicide is formed with a first exposed portion of the semiconductor material disposed between the drain contact silicide and the gate dielectric, and with the portion of the drain doped region disposed by the drain contact silicide. A source extension silicide is formed with a second exposed portion of the semiconductor material disposed between the source contact silicide and the gate dielectric, and with the source doped region disposed by the source contact silicide. The drain and source extension silicides are formed to be thinner than the drain and source contact silicides.

12 Claims, 4 Drawing Sheets

US 6,413,829 B1

FIELD EFFECT TRANSISTOR IN SOI TECHNOLOGY WITH SCHOTTKY-CONTACT EXTENSIONS

TECHNICAL FIELD

The present invention relates generally to fabrication of field effect transistors having scaled-down dimensions, and more particularly, to fabrication of a field effect transistor in SOI (semiconductor on insulator) technology with schottky-contact extensions, for minimizing short-channel effects in the field effect transistor and for reducing the threshold voltage of the field effect transistor.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of buried insulating material 152 is formed on the semiconductor substrate 102, and a layer of semiconductor material 154 is formed on the layer of buried insulating material 152. A drain 156 and a source 158 of the MOSFET 150 are formed in the layer of semiconductor material 154. Elements such as the gate dielectric 116 and the gate electrode 118 having the same reference number in FIGS. 1 and 2 refer to elements having similar structure and function. Processes for formation of such elements 116, 118, 152, 154, 156, and 158 of the MOSFET 150 are known to one of ordinary skill in the art of integrated circuit fabrication.

In FIG. 2, the drain 156 and the source 158 are formed to extend down to contact the layer of buried insulating material 152. Thus, because the drain 156, the source 158, and a channel region 160 of the MOSFET 150 do not form a junction with the semiconductor substrate 102, junction capacitance is minimized for the MOSFET 150 to enhance the speed performance of the MOSFET 150 formed with SOI (semiconductor on insulator) technology.

In addition, referring to FIG. 2, as the dimensions of the MOSFET 150 are scaled down further, the occurrence of undesired short-channel effects increases, as known to one of ordinary skill in the art of integrated circuit fabrication. With short-channel effects, the threshold voltage of the MOSFET 150 changes such that electrical characteristics of such a MOSFET become uncontrollable, as known to one of ordinary skill in the art of integrated circuit fabrication. In the MOSFET 150 of FIG. 2, the layer of semiconductor material 154 is formed to be thin to minimize undesired short-channel effects. However, a low volume of silicide formed with such a thin layer of semiconductor material 154 results in high series resistance at the drain and the source of the MOSFET 150. Furthermore, as dimensions of the MOSFET 150 are scaled down, a lower threshold voltage is desired for scaling down the bias voltages during operation of the MOSFET 150.

Thus, a mechanism is desired for forming a MOSFET with minimized short channel effects and with lower threshold voltage but with higher volume of drain and source contact silicide for the MOSFET formed in SOI (semiconductor on insulator) technology.

SUMMARY OF THE INVENTION

Accordingly, in a general aspect of the present invention, a field effect transistor is fabricated with schottky drain and source extension silicides to minimize short channel effects and for lower threshold voltage. In addition, drain and source contact silicides are formed to have maximized volume to minimize series resistance at the drain and source of the field effect transistor formed in SOI (semiconductor on insulator) technology.

In one embodiment of the present invention, for fabricating a field effect transistor on a buried insulating material in SOI (semiconductor on insulator) technology, a gate dielectric and a gate electrode are formed on the semiconductor material, and spacers are formed on sidewalls of the gate electrode and the gate dielectric. The spacers cover portions of the semiconductor material. A dopant is implanted into exposed regions of the semiconductor material to form a drain doped region and a source doped region. A portion of the drain doped region and a portion of the source doped region extend under the spacers. A drain contact silicide is formed with an exposed portion of the drain doped region, and a source contact silicide is formed with an exposed portion of the source doped region. The spacers are removed to expose the portions of the semiconductor material including a portion of the drain doped region and a portion of the source doped region. A drain extension silicide is formed with a first exposed portion of the semiconductor material disposed between the drain contact silicide and the gate dielectric, and the drain extension silicide is formed also on the portion of the drain doped region disposed by the drain contact silicide. A source extension silicide is formed with a second exposed portion of the semiconductor material disposed between the source contact silicide and the gate dielectric, and the source extension silicide is formed also on the portion of the source doped region disposed by the source contact silicide.

The present invention may be used to particular advantage when additional semiconductor material is epitaxially grown on the exposed portion of the drain doped region to form an elevated drain structure and on the exposed portion of the source doped region to form an elevated source structure. In that case, the drain contact silicide is formed with the elevated drain structure and the drain doped region for a higher volume of the drain contact silicide. In addition, the source contact silicide is formed with the elevated source structure and the source doped region for a higher volume of the source contact silicide.

In this manner, drain and source extension silicides are formed instead of conventional drain and source extension p-n junctions. Drain and source extension silicides, comprised of erbium silicide ($ErSi_2$) for example, have lower contact barrier height than conventional drain and source extension p-n junctions. Thus, the field effect transistor formed with drain and source extension suicides has a lower threshold voltage. In addition, the drain and source extension silicides are formed to be relatively thin, in a range of from about 100 angstroms to about 250 angstroms for example, to minimize short channel effects of the field effect transistor. Furthermore, with maximized volume of the drain and source contact silicides, series resistance at the drain and source of the field effect transistor is minimized to enhance the speed performance of the field effect transistor.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 3:
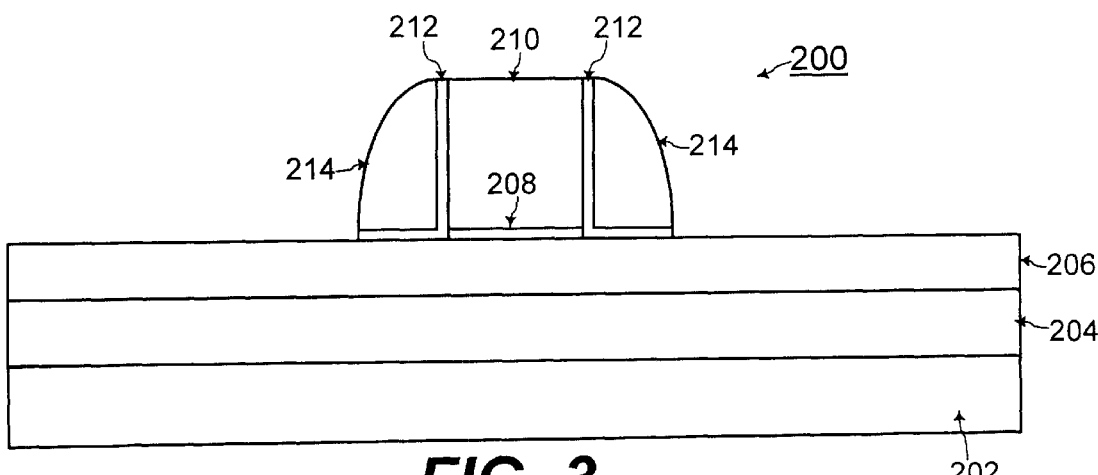
FIGS. 3, 4, 5, 6, 7, 8, 9, and 10 show cross-sectional views for illustrating the steps for fabricating a field effect transistor with drain and source extension silicides and with drain and source contact suicides in SOI (semiconductor on insulator) technology, to minimize undesired short channel effects and to minimize threshold voltage of the field effect transistor, according to an embodiment of the present invention.

In the cross-sectional view of FIG. 3, for fabricating a MOSFET (Metal Oxide Semiconductor Field Effect Transistor) 200 in SOI (semiconductor on insulator) technology, a layer of buried insulating material 204 is deposited on a semiconductor substrate 202. In one embodiment of the present invention, the semiconductor substrate 202 is comprised of silicon, and the layer of buried insulating material 204 is comprised of silicon dioxide ($SiO_2$) having a thickness in a range of from about 800 angstroms to about 3,000 angstroms. Processes for deposition of the layer of buried insulating material 204 on the semiconductor substrate 202 are known to one of ordinary skill in the art of integrated circuit fabrication.

Further referring to FIG. 3, a layer of semiconductor material 206 is deposited on the layer of buried insulating material 204. In one embodiment of the present invention, the layer of semiconductor material 206 is comprised of silicon having a thickness in a range of from about 300 angstroms to about 500 angstroms. Processes for deposition of the layer of semiconductor material 206 on the layer of buried insulating material 204 are known to one of ordinary skill in the art of integrated circuit fabrication.

In addition, referring to FIG. 3, a gate dielectric 208 and a gate electrode 210 are formed on a portion of the layer of semiconductor material 206. The gate dielectric 208 is comprised of silicon dioxide ($SiO_2$) according to one embodiment of the present invention. Alternatively, the gate dielectric 208 is comprised of a dielectric material such as metal oxide for example having a dielectric constant that is higher than that of silicon dioxide ($SiO_2$). When the gate dielectric 208 has a dielectric constant that is higher than the dielectric constant of silicon dioxide ($SiO_2$), the gate dielectric 208 has a higher thickness than if the gate dielectric 208 were comprised of silicon dioxide ($SiO_2$), to minimize undesired tunneling current through the gate dielectric 208. Processes for forming such a gate dielectric 208 are known to one of ordinary skill in the art of integrated circuit fabrication.

The gate electrode 210 is comprised of polysilicon according to one embodiment of the present invention. Processes for forming such a gate electrode 210 are known to one of ordinary skill in the art of integrated circuit fabrication. The present invention may be practiced with other types of materials for the gate dielectric 208 and the gate electrode 210, as would be apparent to one of ordinary skill in the art of integrated circuit fabrication from the description herein.

Figure 4:
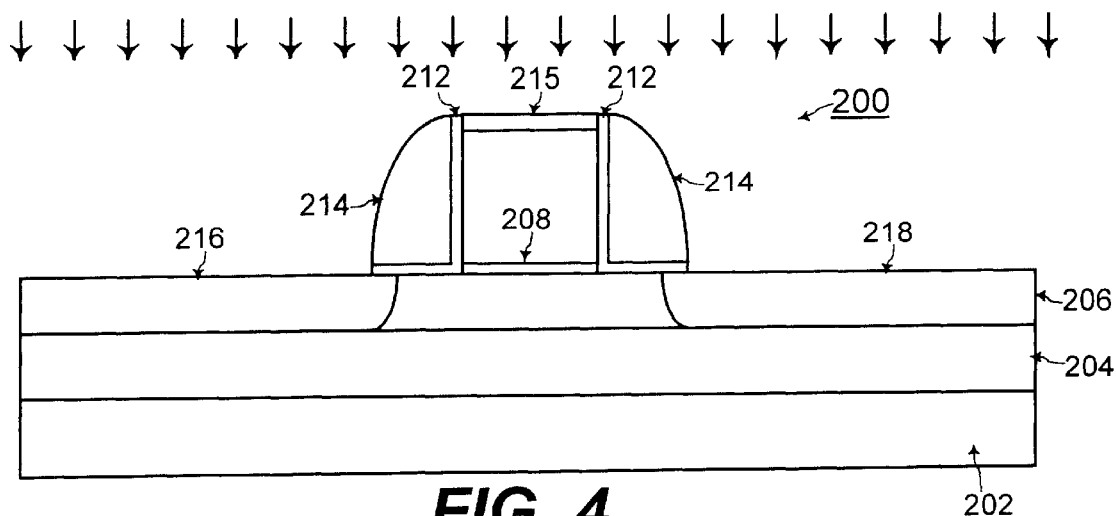

Further referring to FIG. 3, spacers 214 are formed at sidewalls of the gate electrode 210 and the gate dielectric 208. In one embodiment of the present invention, the spacers 214 are comprised of silicon nitride ($Si_3N_4$). In that case, a spacer liner oxide 212 ($SiO_2$) is deposited as a buffer layer between the spacers 214 and the sidewalls of the gate electrode 210 and the gate dielectric 208. Referring to FIG. 4, a capping layer 215 comprised of a dielectric material such as silicon dioxide ($SiO_2$) or a hard-mask material such as silicon nitride ($Si_3N_4$) for example and having a thickness of about 100 angstroms is formed at the top of the gate electrode 210.

Further referring to FIG. 4, a dopant is implanted into exposed regions of the layer of semiconductor material 206 to form a drain doped region 216 and a source doped region 218. The dopant is an N-type dopant such as phosphorous or arsenic for example for fabrication of an NMOSFET (N-channel Metal Oxide Semiconductor Field Effect Transistor). Alternatively, the dopant is a P-type dopant such as boron for example for fabrication of a PMOSFET (P-channel Metal Oxide Semiconductor Field Effect Transistor). Processes for implantation of such dopant are known to one of ordinary skill in the art of integrated circuit fabrication. In addition, a thermal anneal is performed at a relatively high temperature in a range of from about 1000° Celsius to about 1050° Celsius to activate the dopant within the drain doped region 216 and the source doped region 218. Thermal anneal processes for activating dopant are known to one of ordinary skill in the art of integrated circuit fabrication.

Figure 5:
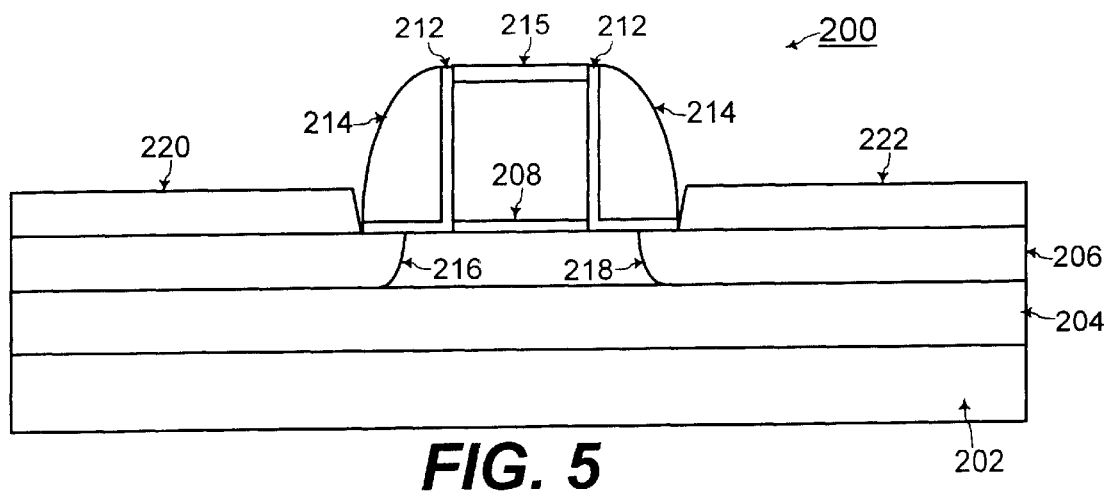

Referring to FIG. 5, an elevated drain structure 220 is formed with silicon epitaxially grown on the exposed drain doped region 216, and an elevated source structure 222 is formed with silicon epitaxially grown on the exposed source doped region 218.

Processes for epitaxially growing silicon are known to one of ordinary skill in the art of integrated circuit fabrication.

Figure 6:
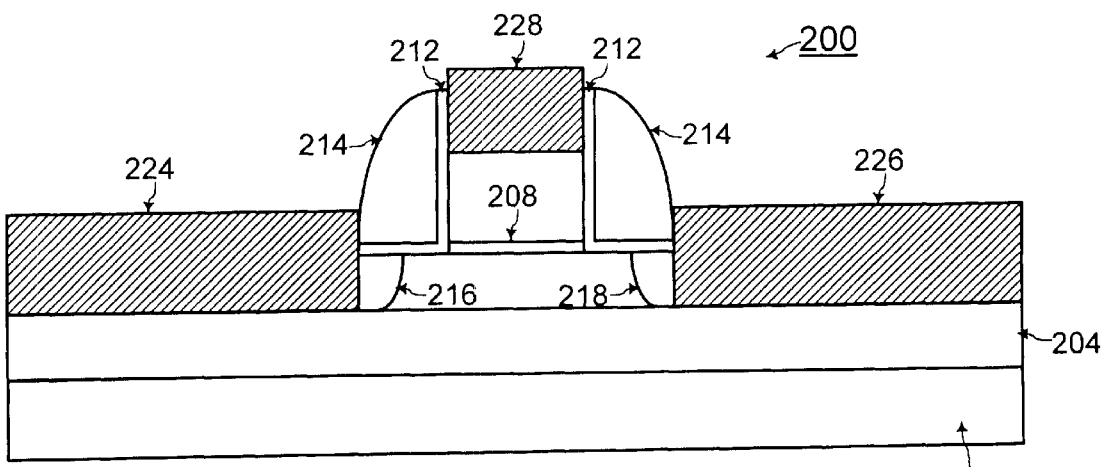

Referring to FIG. 6, a drain contact silicide 224 is formed with the elevated drain structure 220 and the portion of the drain doped region 216 not under the spacer 214. Similarly, a source contact silicide 226 is formed with the elevated source structure 222 and the portion of the source doped region 218 not under the spacer 214. In addition, referring to FIGS. 5 and 6, the capping layer 215 is removed from the top of the gate electrode 210, and a gate silicide 228 is formed with the gate electrode 210 comprised of polysilicon.

The drain and source contact silicides 224 and 226 and the gate silicide 228 are formed to be relatively thick suicides to minimize resistance at the drain, source, and gate of the MOSFET 200. In one embodiment of the present invention, the drain and source contact suicides 224 and 226 extend down to contact the buried insulating material 204 and have a thickness in a range of from about 400 angstroms to about 600 angstroms. Silicidation processes for forming the drain and source contact silicides 224 and 226 and the gate silicide 228 are known to one of ordinary skill in the art of integrated circuit fabrication.

Figure 7:
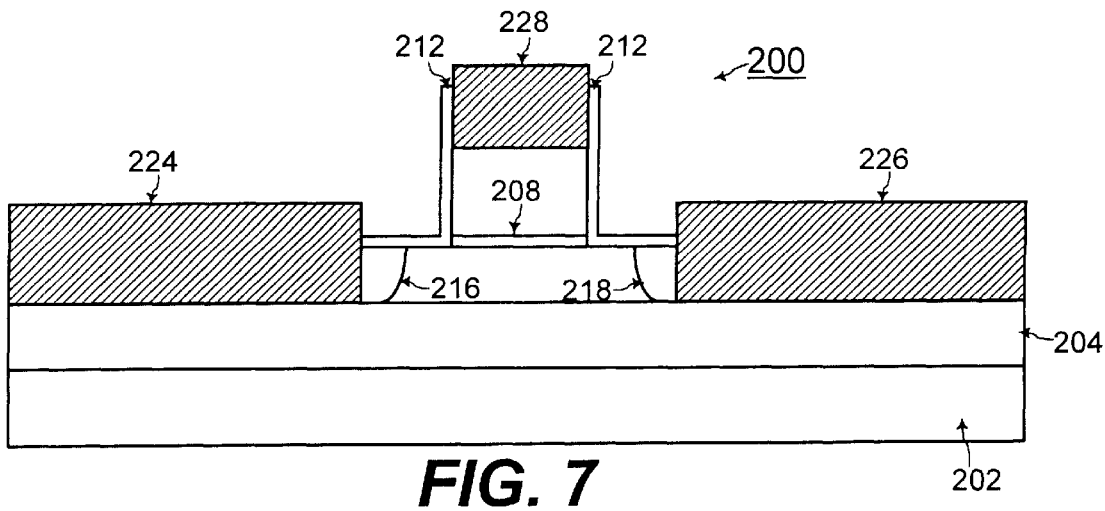

After formation of the drain and source contact silicides 224 and 226, a portion of the drain doped region 216 remains under the spacer 214, and a portion of the source doped region 218 remains under the spacer 214. Referring to FIG. 7, the spacers 214 are removed after formation of the drain and source contact silicides 224 and 226. When the spacers 214 are comprised of silicon nitride ($Si_3N_4$), phosphoric acid ($H_3PO_4$) is used to selectively etch away the spacers 214 comprised of silicon nitride ($Si_3N_4$), according to one embodiment of the present invention. Processes for etching away the spacers 214 comprised of silicon nitride ($Si_3N_4$) for example are known to one of ordinary skill in the art of integrated circuit fabrication.

Figure 8:
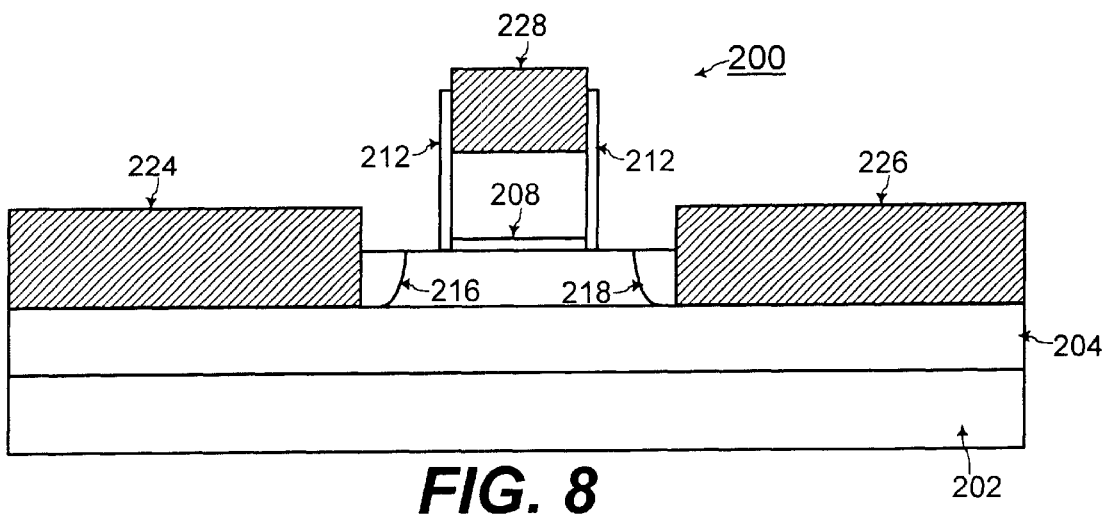

Referring to FIG. 8, the spacer liner oxide 212 is anisotropically etched away such that the spacer liner oxide 212 is removed from the layer of semiconductor material 206. With the anisotropic etch of the spacer liner oxide 212, the spacer liner oxide 212 remains on the sidewalls of the gate electrode 210 and the gate dielectric 208. Processes for anisotropically etching the spacer liner oxide 212 are known to one of ordinary skill in the art of integrated circuit fabrication.

Further referring to FIG. 8, with removal of the spacer liner oxide 212 from the layer of semiconductor material 206, a portion of the drain doped region 216 that was under the spacer 214 is exposed, and a portion of the source doped region 218 that was under the spacer 214 is exposed. The exposed portion of the drain doped region 216 and an exposed portion of the layer of semiconductor material 206 are disposed between the drain contact silicide 224 and the gate dielectric 208. Similarly, the exposed portion of the source doped region 218 and an exposed portion of the layer of semiconductor material 206 are disposed between the source contact silicide 226 and the gate dielectric 208.

Figure 9:
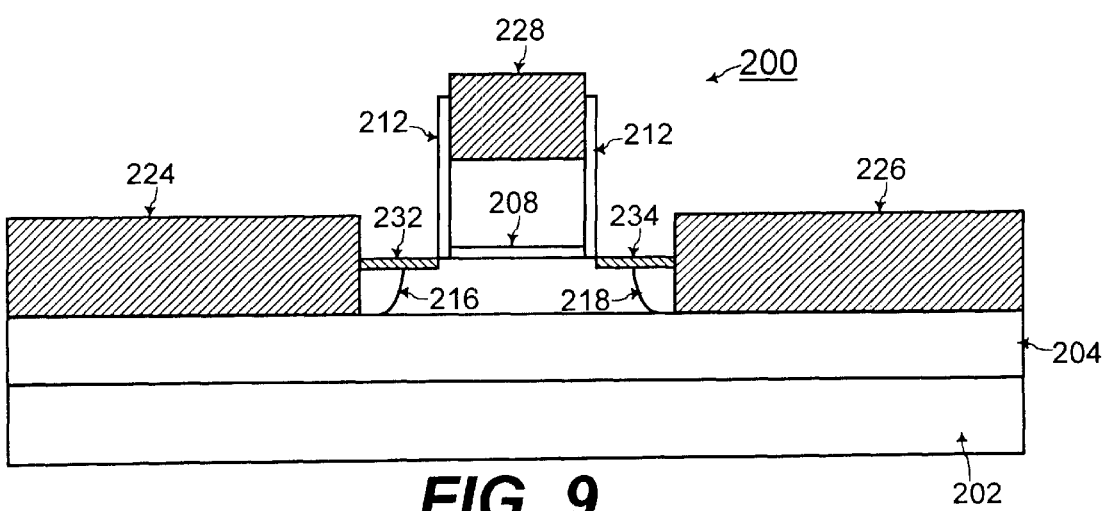

Referring to FIG. 9, a drain extension silicide 232 is formed with the exposed portion of the drain doped region 216 and the exposed portion of the layer of semiconductor material 206 disposed between the drain contact silicide 224 and the gate dielectric 208. Similarly, a source extension silicide 234 is formed with the exposed portion of the source doped region 218 and the exposed portion of the layer of semiconductor material 206 disposed between the source contact silicide 226 and the gate dielectric 208. Silicidation processes for forming the drain and source extension silicides 232 and 234 are known to one of ordinary skill in the art of integrated circuit fabrication.

The drain and source extension silicides 232 and 234 are formed to be relatively thin to minimize short channel effects of the MOSFET 200 having scaled down dimensions of tens of nanometers. According to one embodiment of the present invention, the drain and source extension silicides 232 and 234 have a thickness in a range of from about 100 angstroms to about 250 angstroms when the drain and source contact suicides 224 and 226 have a thickness in a range of from about 400 angstroms to about 600 angstroms.

Figure 1:
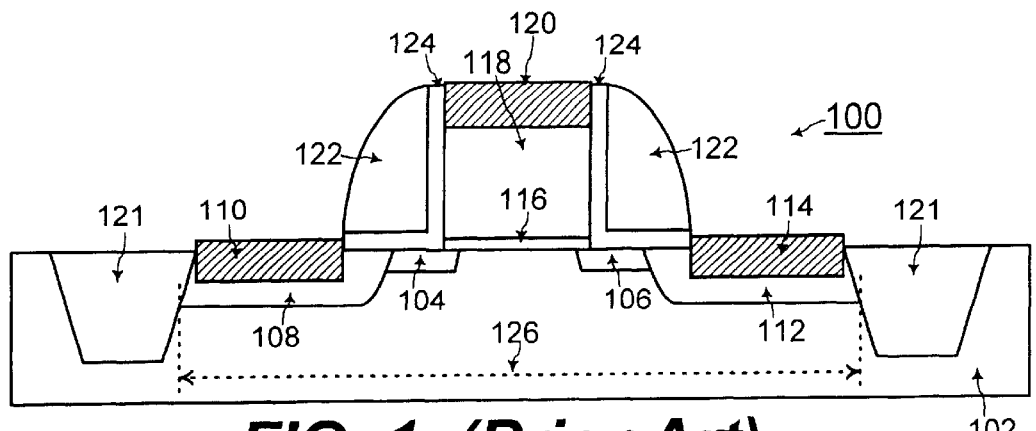
FIG. 1 shows a cross-sectional view of a conventional MOSFET (Metal Oxide Semiconductor Field Effect Transistor) fabricated within a bulk semiconductor substrate, according to the prior art.
Figure 2:
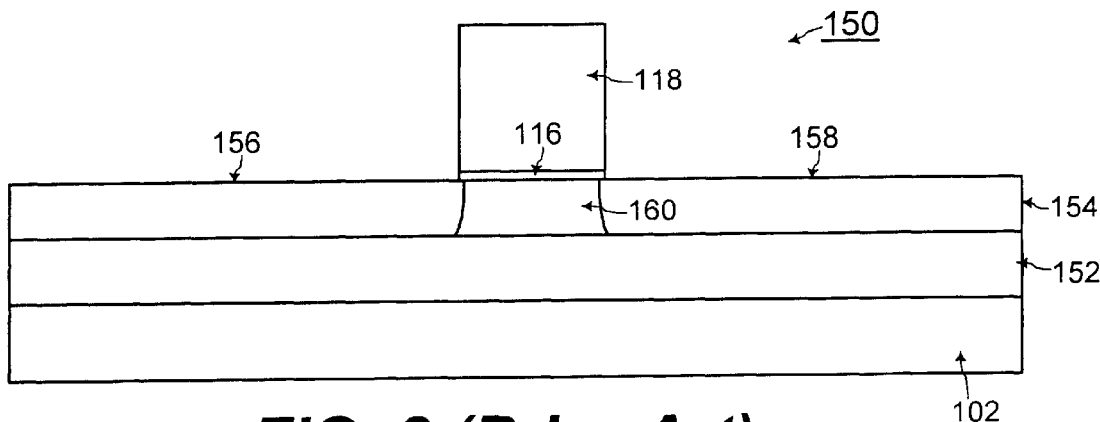
FIG. 2 shows a cross-sectional view of a MOSFET (Metal Oxide Semiconductor Field Effect Transistor) fabricated with SOI (semiconductor on insulator) technology for minimizing junction capacitance, according to the prior art.

In addition, the drain and source extension suicides 232 and 234 are comprised of a silicide such as erbium silicide ($ErSi_2$) providing a reduced contact barrier height. With such drain and source extension suicides 232 and 234 forming schottky-contact extensions for the MOSFET 200, the threshold voltage of the MOSFET 200 is reduced from the conventional p-n extension junctions of FIG. 1. With reduced threshold voltage, the MOSFET 200 operates with reduced bias voltage for lower power dissipation. However, the MOSFET 200 may have higher leakage current with lower threshold voltage. Thus, the MOSFET 200 is formed in SOI (semiconductor on insulator) technology such that the buried insulating material 204 blocks conductance of such leakage current to minimize such undesired leakage current.

Figure 10:
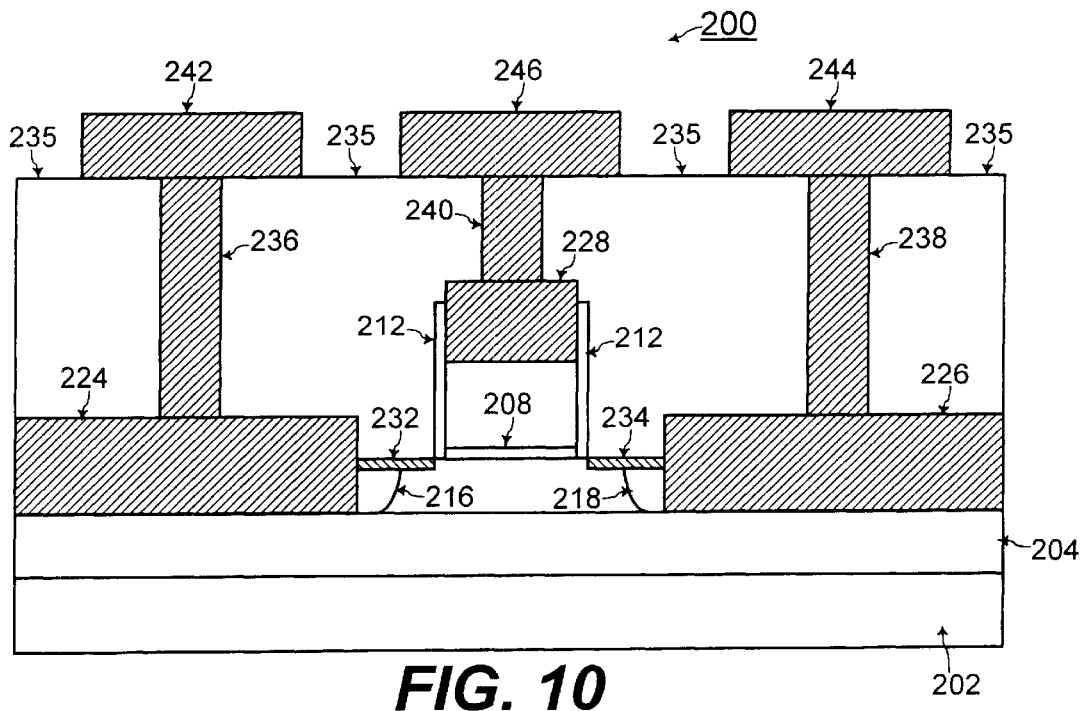

Referring to FIG. 10, a field oxide 235 is deposited to passivate the structures of the MOSFET 200. In addition, a drain via structure 236 is formed through the field oxide 235 to provide connection between a drain contact structure 242 and the drain contact silicide 224. A source via structure 238 is formed through the field oxide 235 to provide connection between a source contact structure 244 and the source contact silicide 226. Similarly, a gate via structure 240 is formed through the field oxide 235 to provide connection between a gate contact structure 246 and the gate silicide 228. Processes for fabricating such interconnect structures, 236, 238, 240, 242, 244, and 246 are known to one of ordinary skill in the art of integrated circuit fabrication.

In this manner, the drain and source extension silicides 232 and 234 are formed instead of conventional drain and source extension p-n junctions for the MOSFET 200. Drain and source extension silicides 232 and 234, comprised of erbium silicide ($ErSi_2$) for example, have lower contact barrier height than conventional drain and source extension p-n junctions. Thus, the MOSFET 200 formed with drain and source extension silicides 232 and 234 has a lower threshold voltage. In addition, the drain and source extension silicides 232 and 234 are formed to be relatively thin, in a range of from about 100 angstroms to about 250 angstroms for example, to minimize short channel effects of the MOSFET 200. Furthermore, with maximized volume of the drain and source contact suicides 224 and 226, series resistance at the drain and source of the MOSFET 200 is minimized to enhance the speed performance of the MOSFET 200.

Figure 11:
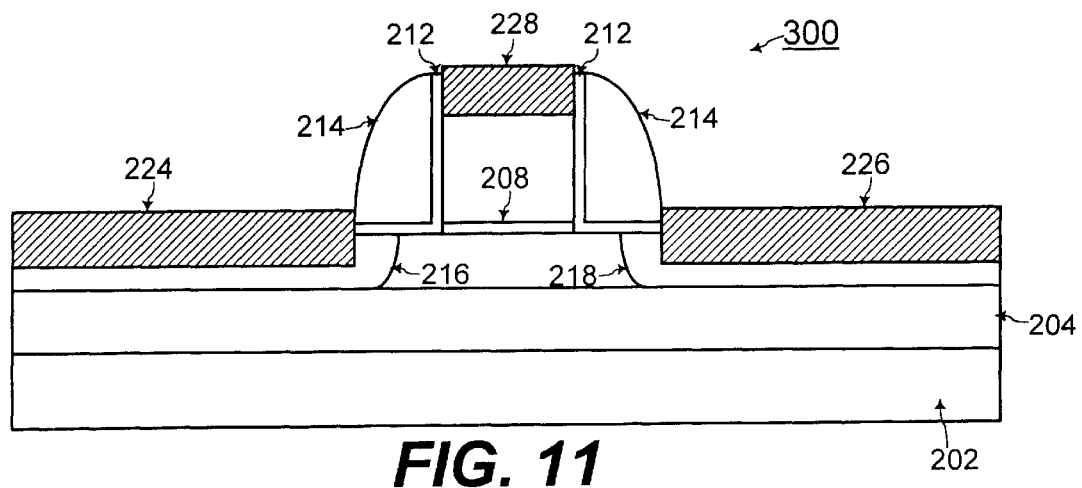
FIG. 11 shows a cross-sectional view of the drain and source contact silicides formed to not extend down to contact the buried insulating material, according to another embodiment of the present invention.

The foregoing is by way of example only and is not intended to be limiting. For example, referring to FIG. 11, the present invention may be practiced when the drain contact silicide 224 and the source contact silicide 226 do not extend down to contact the buried insulating material 204, as would be apparent to one of ordinary skill in the art of integrated circuit fabrication from the description herein, for the MOSFET 300 according to another embodiment of the present invention. Such drain and source contact suicides 224 and 226 that do not contact the buried insulating material 204 may be formed when the layer of semiconductor material 206 is relatively thicker in a range greater than about 500 angstroms. On the other hand, the drain and source contact silicides 224 and 226 may be formed to contact the buried insulating material 204 as illustrated in FIG. 6 for the MOSFET 200 when the layer of semiconductor material 206 is relatively thinner in a range less than about 500 angstroms.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "under," "side," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor on a semiconductor material formed on a buried insulating material in SOI (semiconductor on insulator) technology, the method including the steps of:

A. forming a gate dielectric and a gate electrode on said semiconductor material and forming spacers on sidewalls of said gate electrode and said gate dielectric, wherein said spacers cover portions of said semiconductor material;

B. implanting a dopant into exposed regions of said semiconductor material to form a drain doped region and a source doped region, wherein a portion of said drain doped region and a portion of said source doped region extend under said spacers;

C. forming a drain contact silicide with an exposed portion of said drain doped region and forming a source contact silicide with an exposed portion of said source doped region;

D. removing said spacers to expose said portions of said semiconductor material including a portion of said drain doped region and a portion of said source doped region;

E. forming a drain extension silicide with a first exposed portion of said semiconductor material disposed between said drain contact silicide and said gate dielectric, wherein said drain extension silicide is formed also on said portion of said drain doped region disposed by said drain contact silicide, wherein said step E is performed after said steps C and D such that a silicidation process for forming said drain extension silicide in said step E is separate from a silicidation process for forming said drain contact silicide in said step C; and F. forming a source extension silicide with a second exposed portion of said semiconductor material disposed between said source contact silicide and said gate dielectric, wherein said source extension silicide is formed also on said portion of said source doped region disposed by said source contact silicide, wherein said step F is performed after said steps C and D such that a silicidation process for forming said source extension silicide in said step F is separate from a silicidation process for forming said source contact silicide in said step C.

2. The method of claim 1, further including the steps of:

epitaxially growing semiconductor material on said exposed portion of said drain doped region to form an elevated drain structure and on said exposed portion of said source doped region to form an elevated source structure, before said step C; and forming said drain contact silicide with said elevated drain structure and said drain doped region and forming said source contact silicide with said elevated source structure and said source doped region, in said step C.

3. The method of claim 1, wherein said semiconductor material formed on said buried insulating material is comprised of silicon, and wherein said drain extension silicide and said source extension silicide are comprised of erbium silicide (ErSi$_2$).

4. The method of claim 1, further including the step of:

performing a thermal anneal to activate said dopant within said drain and source doped regions, before said step C.

5. The method of claim 1, wherein said spacers are comprised of silicon nitride (Si$_3$N$_4$) and a spacer liner oxide (SiO$_2$).

6. The method of claim 5, wherein said spacer liner oxide is anisotropically etched in said step D such that said spacer liner oxide remains at said sidewalls of said gate dielectric and said gate electrode comprised of polysilicon.

7. The method of claim 1, wherein said drain and source contact suicides have a thickness in a range of from about 400 angstroms to about 600 angstroms, and wherein said drain and source extension silicides have a thickness in a range of from about 100 angstroms to about 250 angstroms.

8. The method of claim 1, wherein said drain and source contact silicides are formed to extend down to contact said buried insulating material.

9. The method of claim 1, wherein said gate electrode is comprised of polysilicon, and wherein a gate silicide is formed with said gate electrode during said step C.

10. The method of claim 1, wherein said gate dielectric is comprised of a dielectric material having a dielectric constant that is higher than that of silicon dioxide (SiO$_2$), and wherein said gate electrode is comprised of polysilicon.

11. The method of claim 1, wherein said dopant is comprised of an N-type dopant for fabrication of an NMOSFET (N-channel Metal Oxide Semiconductor Field Effect Transistor).

12. The method of claim 1, wherein said dopant is comprised of a P-type dopant for fabrication of a PMOSFET (P-channel Metal Oxide Semiconductor Field Effect Transistor).

* * * * *